United States Patent [19]

Sugawara et al.

[11] Patent Number: 5,272,668

[45] Date of Patent: Dec. 21, 1993

[54] SEMICONDUCTOR MEMORY

[75] Inventors: Michinori Sugawara; Hiroyuki Takahashi, both of Tokyo, Japan

[73] Assignee: NEC Corporation, Tokyo, Japan

[21] Appl. No.: 678,388

[22] Filed: Apr. 1, 1991

[30] Foreign Application Priority Data

Mar. 30, 1990 [JP] Japan ................. 2-84022

[51] Int. Cl.$^5$ ................ G11C 11/407; G11C 7/00; G11C 7/06
[52] U.S. Cl. ................ 365/177; 365/189.01; 365/204
[58] Field of Search ............ 365/177, 204, 214, 189.01

[56] References Cited

U.S. PATENT DOCUMENTS

| 4,829,479 | 5/1989 | Mitsumoto et al. ............ 365/177 |
| 5,111,435 | 5/1992 | Miyamoto ............ 365/177 |

FOREIGN PATENT DOCUMENTS

| 0117787 | 6/1986 | Japan ................. 365/177 |
| 0099983 | 5/1987 | Japan ................. 365/177 |
| 0155589 | 6/1989 | Japan ................. 365/177 |
| 0023594 | 1/1990 | Japan ................. 365/177 |

Primary Examiner—John Zazworsky
Attorney, Agent, or Firm—Sughrue, Mion, Zinn, Macpeak & Seas

[57] ABSTRACT

A semiconductor memory circuit comprises a plurality of memory cells each connected to a corresponding word line and a corresponding pair of digit lines connected connected to a sense amplifier. Each pair of digit lines are connected to one pair of read bus lines, which are respectively connected to emitters of a pair of transistors forming a current-voltage converter. The semiconductor memory circuit also includes one buffer which comprises a first bipolar transistor having an emitter connected to one of the pair of read bus lines, and a second bipolar transistor having an emitter connected to the other of the pair of read bus lines. Bases of the first and second bipolar transistors are connected to each other, and emitters of the first and second bipolar transistors are connected to different current sources, respectively. Collectors of the first and second bipolar transistors are connected being respectively connected to the emitters of the pair of transistors of the current-voltage converter.

3 Claims, 5 Drawing Sheets

SEMICONDUCTOR MEMORY

BACKGROUND OF THE INVENTION

1. Field of the Invention

The present invention relates to a semiconductor memory, and more specifically to a semiconductor memory having a number of memory cells each connected to a selected word line and a selected pair of digit lines and a current-voltage converting circuit connected through a pair of read bus lines to the digit line pairs.

2. Description of related art

In conventional semiconductor memories, each memory cell is connected to a pair of digit lines respectively pulled up by a pair of load transistors. The pair of digit lines are respectively connected to a sense amplifier and are also connected to a pair of driving transistors, respectively. The pair of digit lines are also connected to a pair of read bus lines, which are also connected with a number of pairs of similar digit lines. The pair of read bus lines are also connected to a current-voltage converter.

When a memory cell is selected, data read out of the selected memory cell is transferred by means of the associated sense amplifier to the pair of read bus lines in the form of a potential difference between the pair of read bus lines, which is converted into a voltage signal by the current-voltage converter.

In the above mentioned semiconductor memory, the larger the memory size or capacitor becomes, the longer the read bus lines become, and therefore, wiring resistance of the read bus lines becomes significant. This means that a potential difference between the pair of read bus lines at a position most remote from the current-voltage converter becomes noticeably larger than a potential difference between the pair of read bus lines at a location of the read bus lines closest to the current-voltage converter.

On the other hand, each of the read bus lines is connected with collectors of a number of bipolar transistors respectively included in a number of sense amplifiers connected to the pair of read bus lines. A total of collector capacitances of these transistors become a substantial amount. As a result, the read bus lines have a substantial capacitance. This capacitance is charged and discharged by a voltage amplitude occurring between the pair of read bus lines. Because of this charging and discharging, some delay occurs after an inversion of the voltage difference between the pair of digit lines until an inversion of the voltage difference between a pair of output lines of the current-voltage converter.

This delay gives a delay to a reading speed or time in this type of semiconductor memory. When the memory size or capacity is increased, the number of the sense amplifiers connected to the read bus lines correspondingly increases, and therefore, the capacitance of the read bus lines also increases. As a result, the above mentioned delay becomes more remarkable, and therefore, the reading speed of the memory decreases remarkably.

SUMMARY OF THE INVENTION

Accordingly, it is an object of the present invention to provide a semiconductor memory which has overcome the above mentioned defect of the conventional one.

Another object of the present invention is to provide a semiconductor memory capable of realizing a stable and high reading speed even if the memory size or capacity is increased.

The above and other objects of the present invention are achieved in accordance with the present invention by a semiconductor memory comprising a plurality of memory cells each connected to a corresponding word line and a corresponding pair of digit lines connected to a sense amplifier, the sensing amplifier being connected to one pair of read bus lines, the semiconductor memory circuit also including at least one buffer which comprises a first bipolar transistor having an emitter connected to one of the pair of read bus lines, and a second bipolar transistor having an emitter connected to the other of the pair of read bus lines, bases of the first and second bipolar transistors being connected to each other, and the emitters of the first and second bipolar transistors being connected to different current sources, respectively, collectors of the first and second bipolar transistors being respectively connected to the emitters of the pair of transistors of the current-voltage converter.

With the above mentioned arrangement, the connection of the buffer to the read bus lines has an effect equivalent to reducing the length of the read bus lines. This means that the read bus lines have a reduced wiring resistance. Accordingly, a difference between the potential difference between the pair of read bus lines at a position of a most remote sense amplifier and the potential difference between the pair of read bus lines at a location closest to the buffer becomes small. As a result, the amount of charged and discharged electric charge correspondingly becomes small, and therefore, the charge and discharge time becomes small. Accordingly, the reading time can be speeded up increased.

The above and other objects, features and advantages of the present invention will be apparent from the following description of preferred embodiments of the invention with reference to the accompanying drawings.

DESCRIPTION OF THE PREFERRED EMBODIMENTS

Figure 1:
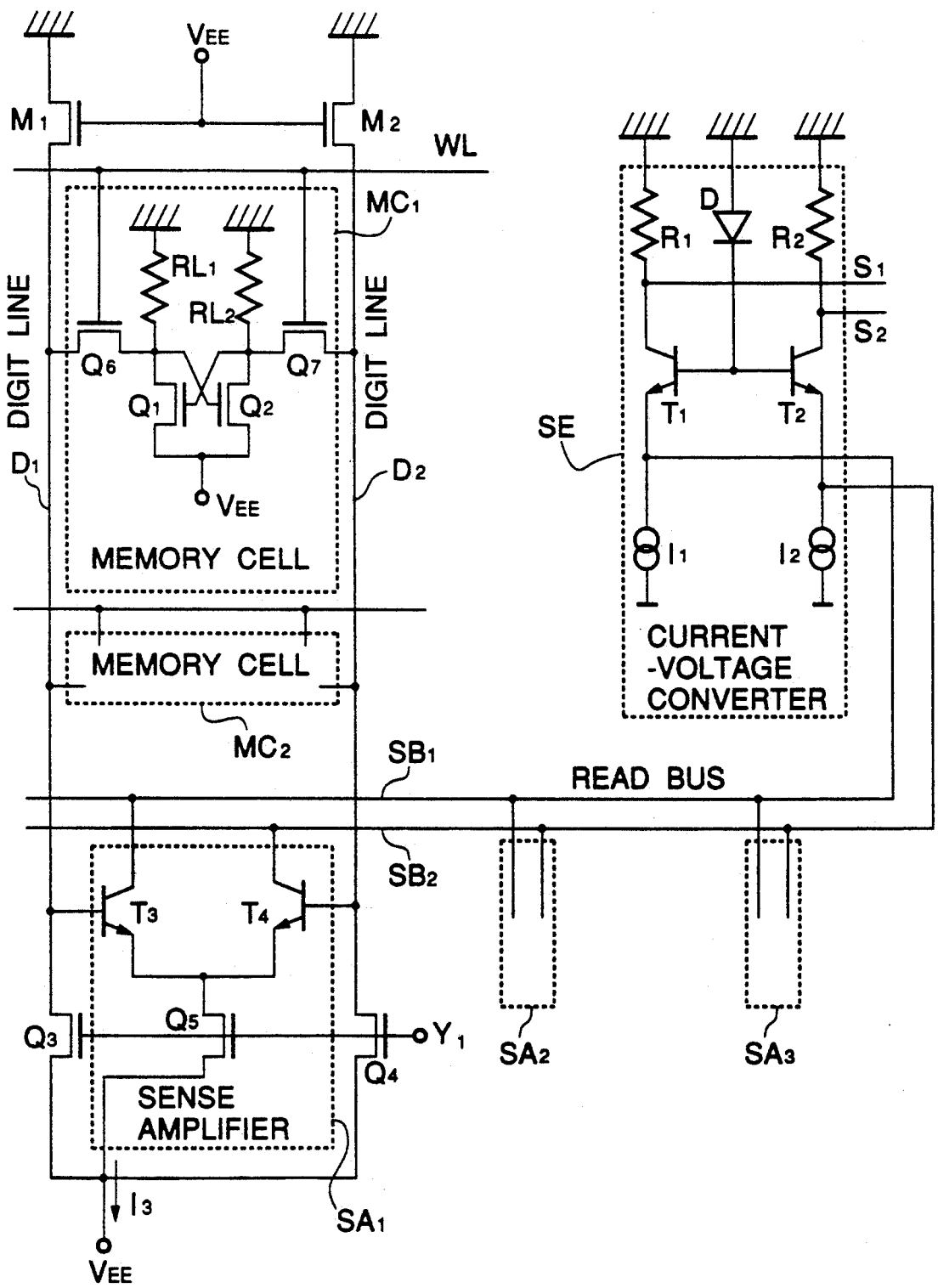
FIG. 1 is a circuit diagram of a conventional semiconductor memory.

Referring to FIG. 1, there is shown a circuit diagram of a conventional semiconductor memory.

The shown conventional semiconductor memory circuit includes a number of memory cells $MC_1$, $MC_2$, . . . arranged in the form of a matrix, but for simplification of the drawing, an internal structure of only one memory cell $MC_1$ is shown. The memory cell $MC_1$ includes a flipflop type information hold circuit composed of NMOS (n-channel MOS) transistors $Q_1$ and $Q_2$ and resistors $RL_1$ and $RL_2$ connected as shown, and transfer gates of NMOS transistors $Q_6$ and $Q_7$ connected between the memory cell and a pair of digit lines $D_1$ and $D_2$. Gates of the MOS transistors $Q_6$ and $Q_7$ are connected to a word line WL, which is selected by a word decoder (not shown).

The digit lines $D_1$ and $D_2$ are pulled up through a load PMOS (p-channel MOS) transistors $M_1$ and $M_2$ for generating a potential difference between the pair of digit lines $D_1$ and $D_2$ dependently upon a current flowing out from the memory cell. Gates of the MOS transistors $M_1$ and $M_2$ are connected in common to a low voltage supply voltage $V_{EE}$. The pair of digit lines $D_1$ and $D_2$ are also connected to the low voltage supply voltage $V_{EE}$ through a pair of NMOS transistor $Q_3$ and $Q_4$, respectively. The pair of digit lines $D_1$ and $D_2$ are also connected to a sense amplifier $SA_1$ in the form of a differential amplifier.

The sense amplifier $SA_1$ includes a pair of bipolar transistors $T_3$ and $T_4$ having bases connected to the pair of digit lines $D_1$ and $D_2$, respectively, and collectors connected to a pair of common read bus lines $SB_1$ and $SB_2$, respectively. Emitters of the pair of bipolar transistors $T_3$ and $T_4$ are connected to each other and also connected in common to a low voltage supply voltage $V_{EE}$ through an NMOS transistor $Q_5$. A digit line selection signal Y1 is applied to the gates to the MOS transistors $Q_3$, $Q_4$ and $Q_5$ so that the pair of digit lines $D_1$ and $D_2$ are selected, and information is transferred from the selected pair of digit lines $D_1$ and $D_2$ to the common read bus lines $SB_1$ and $SB_2$.

Thus, when the digit line selection signal Y1 is activated, a content stored in a one (selected by an activated word line WL) of the memory cells connected to the selected pair of digit lines $D_1$ and $D_2$ is transferred to the sense amplifier $SA_1$ in the form of a voltage difference between the digit lines $D_1$ and $D_2$.

The pair of read bus lines $SB_1$ and $SB_2$ are connected with not only the sense amplifier $SA_1$ but also a number of similar sense amplifiers $SA_2$, $SA_3$, ..., in such a manner that collectors of a pair of bipolar transistors are similarly connected to the pair of read bus lines $SB_1$ and $SB_2$, respectively.

In addition, the pair of read bus lines $SB_1$ and $SB_2$ are connected to a current-voltage converter SE, which includes a pair of bipolar transistors $T_1$ and $T_2$ having emitters connected to the pair of read bus lines $SB_1$ and $SB_2$, respectively and also connected to a pair of constant current sources $I_1$ and $I_2$, respectively. Collectors of the pair of bipolar transistors $T_1$ and $T_2$ are pulled up through a pair of resistor $R_1$ and $R_2$, respectively. Bases of the pair of bipolar transistors $T_1$ and $T_2$ connected to each other and are also pulled up in common by a diode D.

With this arrangement, a difference between collector currents in the sense amplifier is converted to an appropriate voltage difference between the collector of the transistor $T_1$ and the collector of the transistor $T_2$, which is outputted through a pair of output lines $S_1$ and $S_2$ to an output buffer (not shown).

In the above mentioned semiconductor memory, the larger the memory capacity becomes, the longer the read bus lines $SB_1$ and $SB_2$ become, and therefore, a wiring resistance of the read bus lines $SB_1$ and $SB_2$ becomes increasingly larger. For example, in the case of a BiCMOS memory having a memory size of 256 Kbits, the wiring resistance becomes on the order of 150 $\Omega$.

Figure 2:
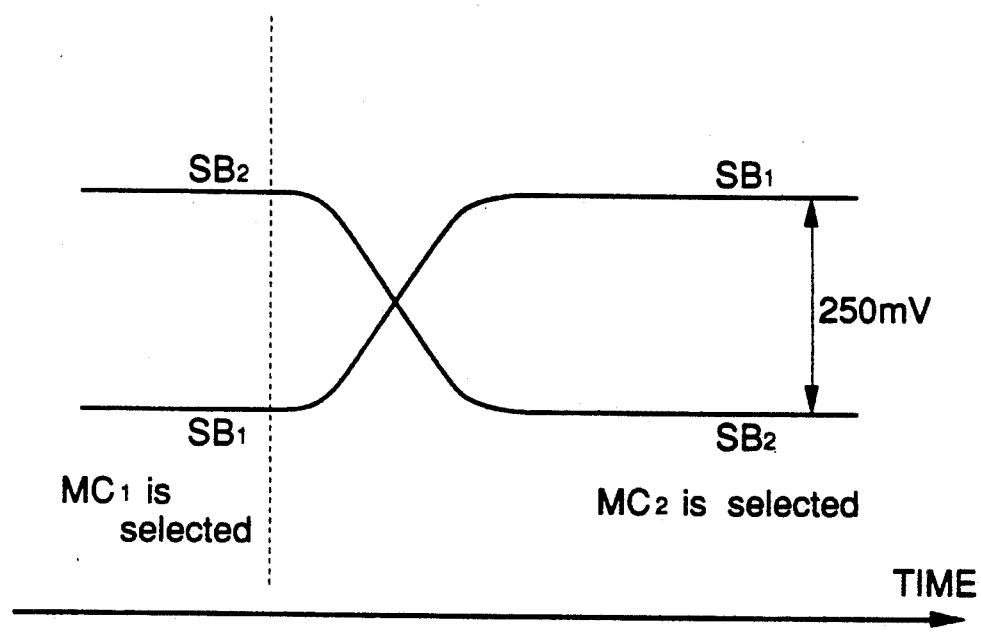
FIGS. 2 and 3 are timing charts showing the voltage change in time at various points in the conventional semiconductor memory shown in FIG. 1.
Figure 3:
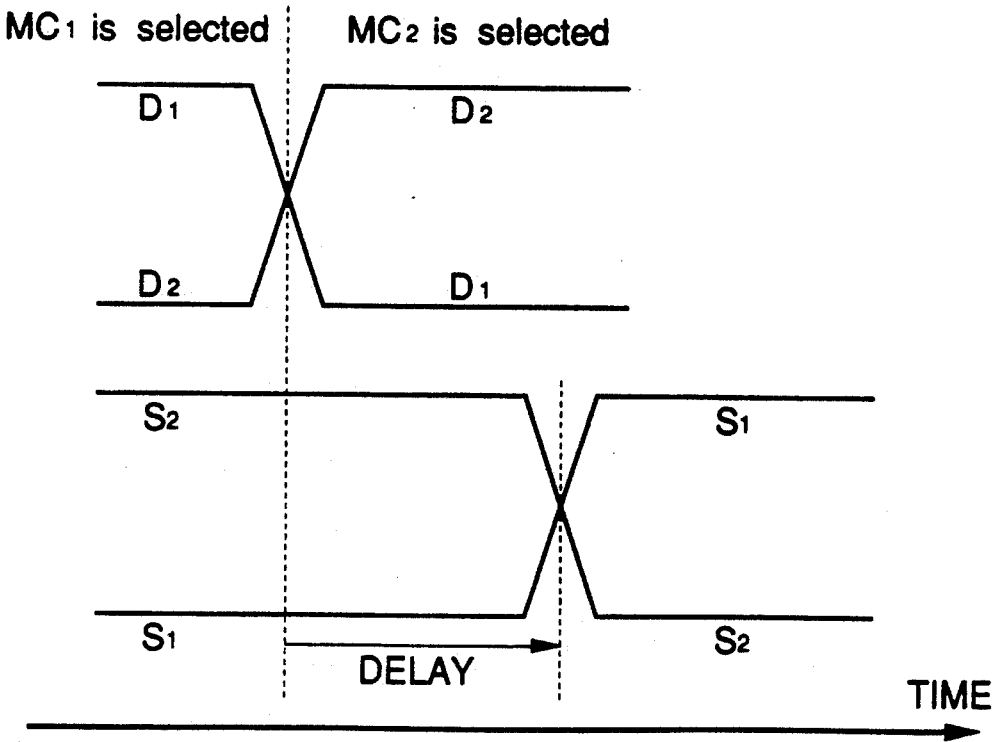

A problem caused by the large wiring resistance will be explained with FIGS. 2 and 3.

Here, assume that the sense amplifier $SA_1$ is at a location most remote from the current-voltage converter SE, and a constant current $I_3$ for the sense amplifier $SA_1$ is 1.5 mA. In addition, assume that the sense amplifier $SA_1$ is selected and the memory cell $MC_1$ is selected, and the memory cell $MC_1$ has such information that a current of 1.5 mA flows through the read bus line $SB_1$ when the memory cell $MC_1$ and the sense amplifier $SA_1$ are selected.

First examine a potential difference between the read bus lines $SB_1$ and $SB_2$. At a position of the read bus lines $SB_1$ and $SB_2$ connected to the current-voltage converter SE (at a position closest to the current-voltage converter SE), the potential difference between the read bus lines $SB_1$ and $SB_2$ is only a difference in a forward direction voltage between the bipolar transistors $T_1$ and $T_2$, which is about 30 mV.

Now, examine the potential difference between the read bus lines $SB_1$ and $SB_2$ at a position of the read bus lines $SB_1$ and $SB_2$ connected to the sense amplifier $SA_1$ (at a position most remote from the current-voltage converter SE). Since no current flows through the read bus line $SB_2$, no voltage drop occurs in the read bus line $SB_2$. Therefore, a potential on the read bus line $SB_2$ close to the sense amplifier $SA_1$ is the same as that appearing on the read bus line $SB_2$ close to the current-voltage converter SE. On the other hand, since the current of 1.5 mA flows through the read bus line $SB_1$, a different between a potential on the read bus line $SB_1$ close to the sense amplifier $SA_1$ and a potential on the read bus line $SB_1$ close to the current-voltage converter SE becomes 225 mV (=150 $\Omega \times$ 1.5 mA). Therefore, a voltage difference between the read bus line $SB_1$ and the read bus line $SB_2$ at a position close to the sense amplifier $SA_1$ becomes about 250 mV ($\approx$255 mV=225 mV+30 mV).

Here, assume that the memory cell $MC_2$ is selected after the memory cell $MC_1$ is selected, and a content stored in the memory cell $MC_2$ is opposite to that stored in the memory cell $MC_1$. In this case, the potentials on the read bus line $SB_1$ and the read bus line $SB_2$ at a position close to the sense amplifier $SA_1$ change respectively with an amplitude of 250 mV, as shown in FIG. 2.

On the other hand, each of the read bus lines $SB_1$ and $SB_2$ is connected with collectors of a number of bipolar transistors included in the sense amplifiers $SA_1$, $SA_1$, $SA_3$, ... connected to the pair of read bus lines $SB_1$ and $SB_2$. A total of collector capacitances of these transistors reaches about 20 pF. A wiring capacitance is about 2 pF which is greatly smaller than the total collector capacitance. As a result, the read bus lines $SB_1$ and $SB_2$ have about 22 pF in total. This capacitance is charged and discharged by the voltage amplitude occurring in the read bus lines $SB_1$ and $SB_2$. Because of this charging and discharging, some delay occurs after an inversion of the voltage difference between the pair of digit lines $D_1$ and $D_2$ until an inversion of the voltage difference between the pair of output lines $S_1$ and $S_2$.

In fact, when the current $I_3$ has been switched from the read bus line $SB_1$ to the read bus line $SB_2$, since the potential of the read bus line $SB_2$ drops, a current is supplied from the above mentioned capacitance. Therefore, after the discharge of the read bus line $SB_2$ has been completed, a current $I_3$ begins to be actually supplied from the bipolar transistor $T_2$ of the current-voltage converter SE. On the other hand, the current from the bipolar transistor $T_1$ does not immediately stop. A current flows into the read bus line $SB_1$ until the capacitance associated with the read bus line $SB_1$ has been completely charged. Because of this process, the inversion of the voltage difference between the output lines $S_1$ and $S_2$ is delayed.

Now, this delay will be estimated:

Assume that the sense amplifiers $SA_1$, $SA_2$, $SA_3$, ... are located along the pair of read bus lines $SB_1$ and $SB_2$ at equal intervals. Also assuming that the number of the sense amplifiers $SA_1$, $SA_2$, $SA_3$, ... is N, and the total capacitance of the read bus lines is C, an accumulated electric charge Q can be expressed as follows:

$$Q = \sum_{n=1}^{N} (C/N)(n/N)V = (CV/N^2)\{(N^2/2) + (N/2)\} \approx (CV/2)$$

Here, V is a voltage difference between the read bus lines $SB_1$ and $SB_2$ at a location most remote from the current-voltage converter SE. Therefore, substituting C=22 pF and V=250 mV, the electric charge is obtained as follows:

$$Q = (\tfrac{1}{2})(22 \text{ pF})(250 \text{ mV}) = 2.8 \text{ pC}$$

This means that the read bus line $SB_2$ having changed from a no-current flowing condition to a current flowing condition discharges the electric charge of 2.8 pC in the form of the current $I_3$. A time "t" required for this discharge is expressed as follows:

$$t = Q/I_3 = (2.8 \text{ pC})/(1.5 \text{ mA}) \approx 1.9 \text{ ns}$$

Namely, it would be understood that a delay of about 1.9 ns occurs.

In general, this type of semiconductor memory has a reading speed or time on the order of 10 ns to 20 ns. Therefore, this delay corresponds to 10% to 20% of the reading time.

If the memory size or capacity is increased, the number of the sense amplifiers connected to the common read bus lines correspondingly increases, and therefore, the capacitance of the read bus lines also increases. As a result, the above mentioned delay becomes more remarkable.

Figure 4:
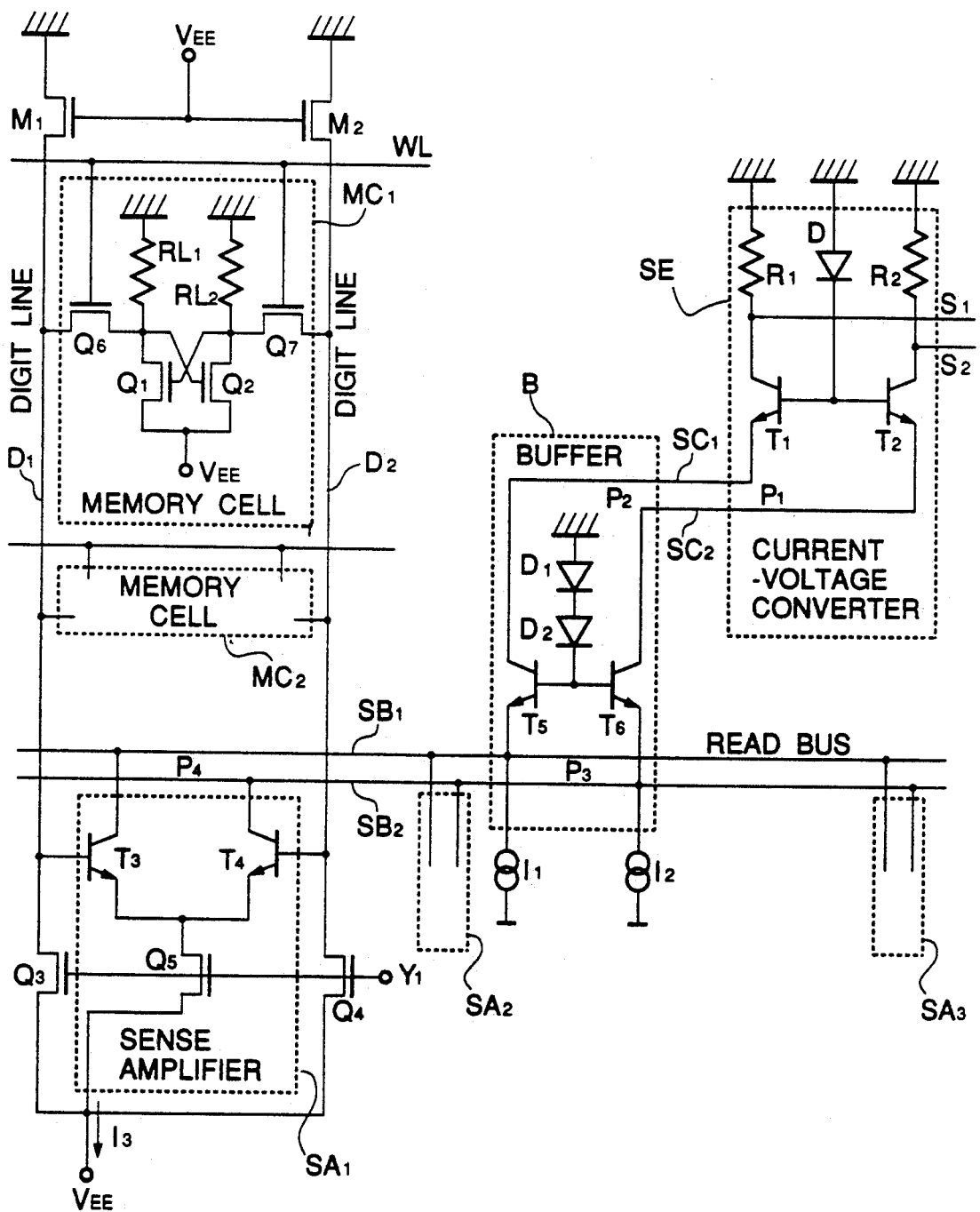
FIGS. 4, 5 and 6 are circuit diagrams of first, second and third embodiments of the semiconductor memory in accordance with the present invention.

Referring to FIG. 4, there is shown a circuit diagram of a first embodiment of the semiconductor memory circuit in accordance with the present invention. In FIG. 4, elements similar to those shown in FIG. 1 are given the same Reference Signs, and explanation thereof will be omitted for simplification of description.

The semiconductor memory circuit shown in FIG. 4 additionally comprises a buffer B including a pair of bipolar transistors $T_5$ and $T_6$, which in turn have emitters connected to center points of the read bus lines $SB_1$ and $SB_2$, respectively. The emitters of the bipolar transistors $T_5$ and $T_6$ are also connected to the constant current sources $I_1$ and $I_2$, respectively. The bases of the bipolar transistors $T_5$ and $T_6$ are directly connected to each other and pulled up through an impedance element such as series-connected diodes $D_1$ and $D_2$ to a high voltage. Collectors of the bipolar transistors $T_5$ and $T_6$ are connected through a pair of lines $SC_1$ and $SC_2$ to the emitters of the transistors $T_1$ and $T_2$ of the current-voltage converter SE, respectively.

Now, an operation of the semiconductor memory shown in FIG. 4 will be explained.

Similarly to the operation situations explained in connection to the conventional semiconductor memory shown in FIG. 1 with reference to FIGS. 2 and 3, assume that the sense amplifier $SA_1$ is at a location most remote from the current-voltage converter SE, and that the sense amplifier $SA_1$ and the memory cell $MC_1$ are selected, so that a current $I_3$ (=1.5 mA) flows through the read bus line $SB_1$.

Under this condition, examine a voltage difference $V_{SB}$ between the read bus lines $SB_1$ and $SB_2$ and a voltage difference $V_{SC}$ between the lines $SC_1$ and $SC_2$.

A potential difference $V_{SB}(P_3)$ between the read bus lines $SB_1$ and $SB_2$ at a position closest to the buffer B and a potential difference $V_{SC}(P_1)$ between the lines $SC_1$ and $SC_2$ at a position closest to the current-voltage converter SE are about 30 mV. On the other hand, since the wiring conductor length of the read bus lines $SB_1$ and $SB_2$ between the most remote sense amplifier $SA_1$ and the buffer B becomes a half of the wiring conductor length (between the most remote sense amplifier $SA_1$ and the current-voltage converter SE) in the case of the conventional example, and therefore, the wiring resistance also becomes a half. Therefore, a potential difference $V_{SB}(P_4)$ between the read bus lines $SB_1$ and $SB_2$ at a position closest to the sense amplifier $SA_1$ and a potential difference $V_{SC}(P_2)$ between the between the lines $SC_1$ and $SC_2$ at a position closest to the buffer B becomes about 140 mV, because $$1.5 \text{ mA} \times (150 \text{ }\Omega/2) + 30 \text{ mV} = 142.5 \text{ mV} \approx 140 \text{ mV}$$

$$V_{SB}(P_3) = V_{SC}(P_1) = 30 \text{ mV}$$

$$V_{SB}(P_4) = V_{SC}(P_2) = 140 \text{ mV}$$

In addition, the voltage difference between the pair of read bus lines $SB_1$ and $SB_2$ at a side of the buffer B opposite to the sense amplifier $SA_1$ is also 30 mV, since no current flows through the pair of read bus lines $SB_1$ and $SB_2$ at the side of the buffer B opposite to the sense amplifier $SA_1$.

Here, assume that the memory cell $MC_2$ is selected after the memory cell $MC_1$ is selected, and a content stored in the memory cell $MC_2$ is opposite to that stored in the memory cell $MC_1$. In this case, the read bus $SB_1$ and $SB_2$ change with the amplitude of $V_{SB}$ and the lines $SC_1$ and $SC_2$ change with the amplitude of $V_{SC}$. An electric charge Q charged and discharged at this time can be estimated as follows:

$$Q = (1/2) \times (22 \text{ pF}/2) \times 140 \text{ mV} + (22 \text{ pF}/2) \times 30 \text{ mV} + (1/2) \times (2 \text{ pF}/2) \times 140 \text{ mV}$$

$$= 1.17 \text{ pC}$$

Each of the read bus lines $SB_2$ and the line $SC_2$ discharges this amount of electric charge by the current $I_3$, respectively. As mentioned above, since $I_3 = 1.5$ mA, the time "t" for the discharge is expressed as follows:

$$t = (1.17 \text{ pC}/1.5 \text{ mA}) \approx 0.8 \text{ ns}$$

Namely, the delay can be reduced to a value which is about 40% of the delay of about 2 ns in the conventional semiconductor memory.

Figure 5:
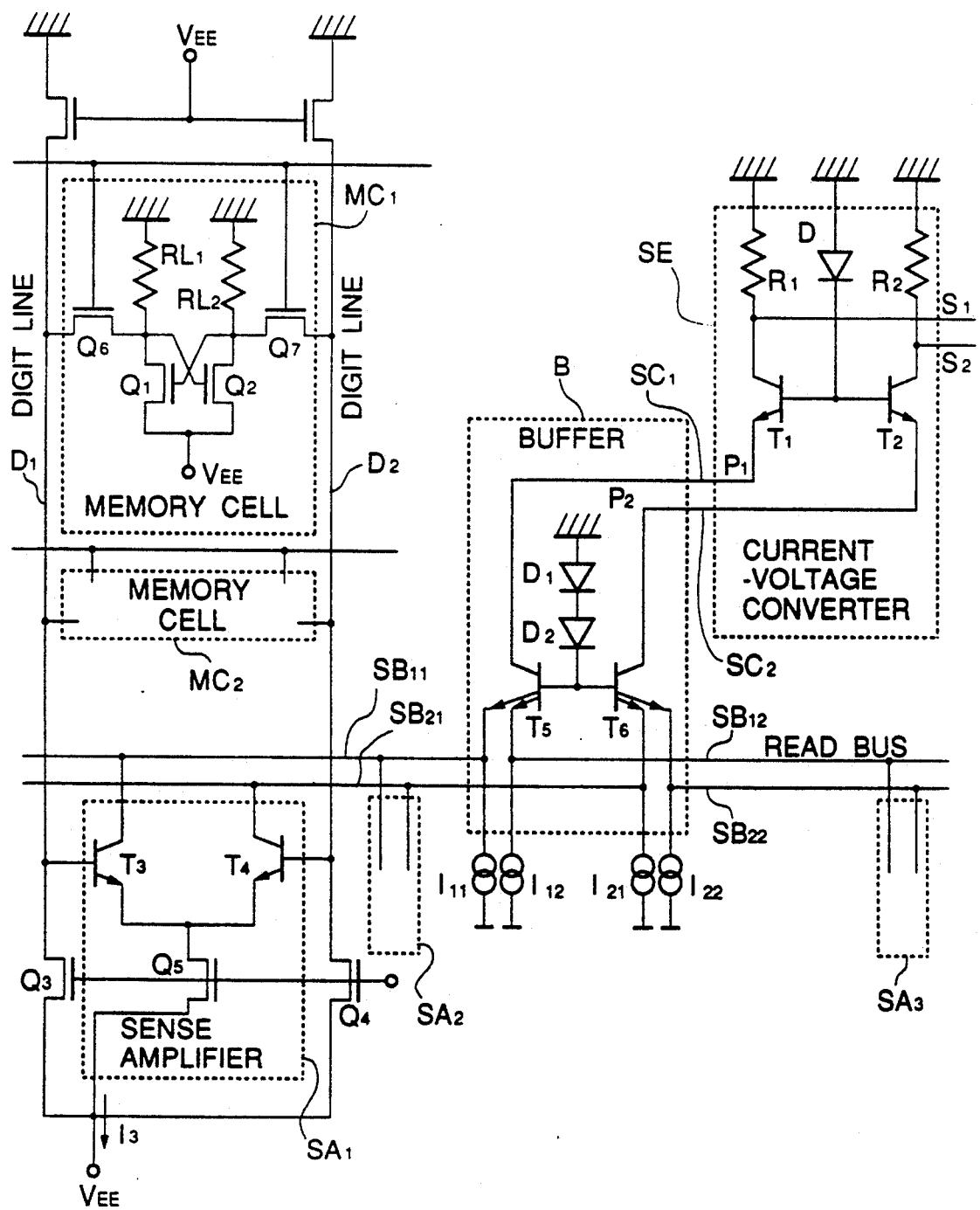

Referring to FIG. 5, there is shown a second embodiment of the semiconductor memory in accordance with the present invention. In FIG. 5, elements similar to those shown in FIGS. 1 and 4 are given the same Reference Signs, and explanation thereof will be omitted for simplification of description.

As seen from comparison between FIGS. 4 and 5, the second embodiment is characterized in that the bipolar transistors $T_5$ and $T_6$ are of a double emitter type and the read bus lines SB1 and SB2 are divided at their center points into portions $SB_{11}$ and $SB_{21}$ and portions $SB_{21}$ and $SB_{22}$, respectively, so that first and second emitters of the transistor $T_5$ are connected to the read bus line portions $SB_{11}$ and $SB_{12}$, respectively, and first and second emitters of the transistor $T_6$ are connected to the read bus line portions $SB_{21}$ and $SB_{22}$, respectively.

When the second embodiment of the semiconductor memory operates under the same situation as that explained with reference to the first embodiment, since no current flows in the read bus line portions $SB_{12}$ and $SB_{22}$ isolated from the selected sense amplifier $SA_1$, no voltage difference occurs between the read bus line portions $SB_{12}$ and $SB_{22}$ isolated from the selected sense amplifier $SA_1$. Namely, a voltage change with a voltage amplitude does not occur in the read bus line portions $SB_{12}$ and $SB_{22}$ isolated from the selected sense amplifier $SA_1$.

Therefore, the discharged and charged electric charge is expressed as follows:

$Q = (1/2) \times (22 \text{ pF}/2) \times 140 \text{ mV} + (1/2) \times$ $(2 \text{ pF}/2) \times 140 \text{ mV}$ $= 0.84 \text{ pC}$ The time "t" required for the read bus lines $SB_2$ and the line $SC_2$ to discharge this amount of electric charge is estimated as follows:

$t = (0.84 \text{ pC}/1.5 \text{ mA}) \approx 0.6 \text{ ns}$

Thus, by cutting the read bus lines, the reading speed can be increased in comparison with the first embodiment by 0.2 ns.

Figure 6:
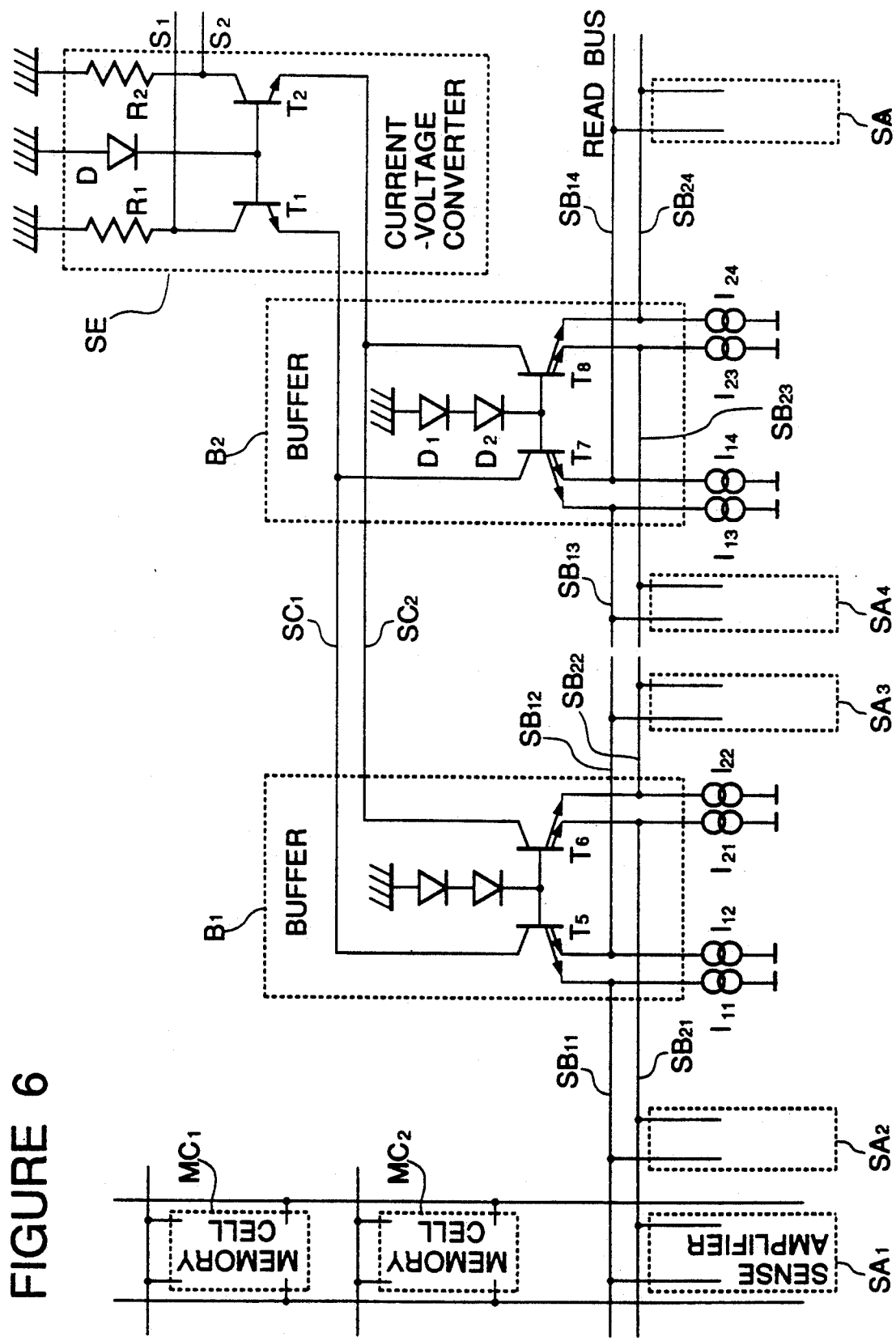

Referring to FIG. 6, there is shown a third embodiment of the semiconductor memory in accordance with the present invention. In FIG. 6, elements similar to those shown in FIGS. 1, 4 and 5 are given the same Reference Signs, and explanation thereof will be omitted for simplification of description. In addition, the internal structure of the memory cells $MC_1$ and $MC_2$ are not shown for simplification of the drawing.

In the third embodiment, each of the read bus lines $SB_1$ and $SB_2$ is cut at three points so that the read bus lines $SB_1$ and $SB_2$ are respectively divided into four portions $SB_{11}$, $SB_{12}$, $SB_{13}$ and $SB_{14}$, and $SB_{21}$, $SB_{22}$, $SB_{23}$ and $SB_{24}$, which have the same length. In addition, two buffers $B_1$ and $B_2$ having the same construction as that of the buffer B shown in FIG. 5 are provided. Each of the two buffers $B_1$ and $B_2$ includes a pair of double-emitter bipolar transistors $T_5$ and $T_6$ or $T_7$ and $T_8$. First and second emitters of the transistor $T_5$ of the first buffer $B_1$ are connected to the read bus line portions $SB_{11}$ and $SB_{12}$, respectively, and to current sources $I_{11}$ and $I_{12}$, respectively, and first and second emitters of the transistor $T_7$ of the second buffer $B_2$ are connected to the read bus line portions $SB_{13}$ and $SB_{14}$, respectively, and to current sources $I_{13}$ and $I_{14}$, respectively. First and second emitters of the transistor $T_6$ of the first buffer $B_1$ are connected to the read bus line portions $SB_{21}$ and $SB_{22}$, respectively, and to current sources $I_{21}$ and $I_{22}$, respectively, and first and second emitters of the transistor $T_8$ of the second buffer $B_2$ are connected to the read bus line portions $SB_{23}$ and $SB_{24}$, respectively and to current sources $I_{23}$ and $I_{24}$, respectively.

The read bus line portions portions $SB_{11}$, $SB_{12}$, $SB_{13}$ and $SB_{14}$ have a length of one fourth of the read bus line $SB_1$ of the first embodiment, and the read bus line portions portions $SB_{21}$, $SB_{22}$, $SB_{23}$ and $SB_{24}$ have a length of one fourth of the read bus line $SB_2$ of the first embodiment. In addition, the wiring lines $SC_1$ and $SC_2$ connected to the buffers $B_1$ and $B_2$ have a length of three fourths of the read bus line $SB_1$ in the first embodiment.

In this case, assuming that the third embodiment operates under the same condition as those of the operations of the first and second embodiments explained hereinbefore, the discharged and charged electric charge is expressed as follows:

$Q = (1/2) \times (22 \text{ pF}/4) \times 90 \text{ mV} + (1/2) \times \{(3/4) \times 2 \text{ pF}\} \times$ $200 \text{ mV} + (1/2) \times (22 \text{ pF}/4) \times 90 \text{ mV}$ $\approx 0.65 \text{ pC}$ The time "t" required for the read bus line $SB_2$ and the line $SC_2$ to discharge this amount of electric charge is estimated as follows:

$t = (0.65 \text{ pC}/1.5 \text{ mA}) \approx 0.4 \text{ ns}$

Thus, by cutting the read bus line into four portions, the reading speed can be increased in comparison with the first embodiment by 0.4 ns.

The invention has thus been shown and described with reference to the specific embodiments. However, it should be noted that the present invention is in no way limited to the details of the illustrated structures but changes and modifications may be made within the scope of the appended claims.

We claim:

1. A semiconductor memory circuit comprising a plurality of memory cells each connected to a corresponding word line and a corresponding pair of digit lines connected to a sense amplifier, said sense amplifier being connected to one pair of read bus lines, the semiconductor memory circuit also including at least one buffer which comprises a first bipolar transistor having an emitter connected to one of said pair of read bus lines, and a second bipolar transistor having an emitter connected to the other of said pair of read bus lines, bases of said first and second bipolar transistor being connected to each other, and the emitters of said first and second bipolar transistors being connected to different current sources, respectively, collectors of said first and second bipolar transistors being respectively connected to emitters of a pair of transistors which form a current-voltage converter.

2. A semiconductor memory comprising a plurality of memory cells each connected to a corresponding word line and a corresponding pair of digit lines connected to a sense amplifier, said sense amplifier being connected to one pair of read bus lines, the semiconductor memory circuit also including at least one buffer which comprises a first bipolar transistor having an emitter connected to one of said pair of read bus lines, and a second bipolar transistor having an emitter connected to the other of said pair of read bus lines, bases of said first and second bipolar transistors being connected to each other, and the emitters of said first and second bipolar transistors being connected to different current sources, respectively, collectors of said first and second bipolar transistors being respectively connected to emitters of a pair of transistors which form a current-voltage converter, wherein each of said read bus lines is divided into first and second portions and wherein said first and second bipolar transistors of said at least one buffer are of a double-emitter type and connected to said read bus lines in such a manner that first and second emitters of said first bipolar transistor are connected to the first and second portions of one of said read bus lines, respectively, and first and second emitters of said second bipolar transistor are connected to the first and second portions of the other of said read bus lines, respectively.

3. A semiconductor memory comprising a plurality of memory cells each connected to a corresponding word line and a corresponding pair of digit lines connected to a sense amplifier, said sense amplifier being connected to one pair of read bus lines, the semiconductor memory circuit also including at least one buffer which comprises a first bipolar transistor having an emitter connected to one of said pair of read bus lines, and a second bipolar transistor having an emitter connected to the other of said pair of read bus lines, bases of said first and second bipolar transistors being connected to each other, and the emitters of said first and second bipolar transistors being connected to different current sources respectively, collectors of said first and second bipolar transistors being respectively connected to emitters of a pair of transistors which form a current-voltage converter, the semiconductor memory further including first and second buffers each of which comprises first and second bipolar transistors of a double-emitter type having bases connected in common to each other, collectors of said first bipolar transistor of each of said first and second buffers being connected to each other and also connected to said emitter of one of said pair of transistors of said current-voltage converter, and collectors of said second bipolar transistor of each of said first and second buffers being connected to each other and also connected to said emitter of the other of said pair of transistors of said current-voltage converter, first and second emitters of each of said first and second bipolar transistors of each of said first and second buffers being connected to different current sources, respectively, and wherein each of said read bus lines is divided into first, second, third and fourth portions and wherein said first and second bipolar transistors of said first and second buffers are connected to said read bus lines in such a manner that the first and second emitters of said first bipolar transistor of said first buffer are connected to the first and second portions of one of said read bus lines, respectively; the first and second emitters of said second bipolar transistor of said second buffer are connected to the third and fourth portions of one of said read bus lines, respectively; the first and second emitters of said second bipolar transistor of said first buffer are connected to the first and second portions of the other of said read bus lines, respectively; and the first and second emitters of said second bipolar transistor of said second buffer are connected to the third and fourth portions of the other of said read bus lines, respectively.

* * * * *